United States Patent [19]

Bury

[11] Patent Number: 4,507,718
[45] Date of Patent: Mar. 26, 1985

[54] LED HOLDER

[75] Inventor: George J. Bury, Lake Villa, Ill.

[73] Assignee: Illinois Tool Works Inc., Chicago, Ill.

[21] Appl. No.: 590,307

[22] Filed: Mar. 16, 1984

[51] Int. Cl.³ .............................................. F21V 21/00
[52] U.S. Cl. .................................... 362/396; 362/368; 362/370; 362/382; 362/455; 362/800
[58] Field of Search ............... 362/396, 382, 455, 800, 362/368, 370

[56] References Cited

U.S. PATENT DOCUMENTS 4,195,330  3/1980  Savage ................................. 362/800
4,419,722  12/1983  Bury .................................... 362/800

Primary Examiner—Stephen J. Lechert, Jr.
Attorney, Agent, or Firm—J. P. O'Brien; T. W. Buckman

[57] ABSTRACT

An improved holder for a light emitting diode comprising a one-piece flexible cylindrical body having a flange portion with a central opening, a pair of spaced apart integrally formed resilient short leg portions extending from said flange portion axially of said cylindrical body and a pair of spaced apart integrally formed resilient long leg portions extending from said flange portion axially of said cylindrical body and spaced ninety degrees from said short leg portions. The short leg portions include a means for latching the holder in an aperture on a panel. The improvement comprises a retaining shoulder integrally formed at the extremity of each of the pair of long leg portions which extend inward of the cylindrical body at an angle toward the flange portion in the range of three degrees to eight degrees relative to a radial line extending from the axis of the cylindrical body.

3 Claims, 4 Drawing Figures

16

LED HOLDER

BACKGROUND OF THE INVENTION

This invention relates to an improvement for light emitting diode holders, and in particular for light emitting diode holders of the type disclosed in U.S. Pat. No. 4,419,722, which issued to the same inventor as the inventor of this invention and which is assigned to the same assignee as the assignee of this invention.

U.S. Pat. No. 4,419,722 describes a light emitting diode holder made of resilient plastic material that is molded into a one-piece cyindrical shaped body having a central bore configured to receive a light emitting diode. A flange is formed at one end of the cylindrical body to hold the diode holder about an aperture in a panel. A pair of resilient legs having snap-over retaining shoulders are formed axially of the cylindrical body for engaging the panel on the opposite side of the flange to secure the diode holder in the aperture. A second pair of longer leg portions are formed axially of the body and include snap-over shoulders for receiving flange at the base of the light emitting diode to secure the light emitting diode in the holder.

In using a light emitting diode holder of the type described in the Bury patent, it has been found that an axial inwardly directed force on the LED causes the longer legs to lose their gripping force on the LED and the LED is then dislodged from the LED holder. This invention is directed to an improvement to correct this problem.

SUMMARY OF THE INVENTION

This invention is directed to an improvement for LED holders of the type described in the above-described Bury patent. The LED holder of this invention has a retaining shoulder formed at the free end of its longer leg portions which is disposed at an angle towards the flange portion of the LED holder in the critical range of three degrees to eight degrees relative to a radial line extending from the axis of the cylindrical body.

DESCRIPTION OF DRAWING

For a better understanding of this invention, reference may be made to the accompanying drawing, in which.

DESCRIPTION OF PREFERRED EMBODIMENT

Figure 1:
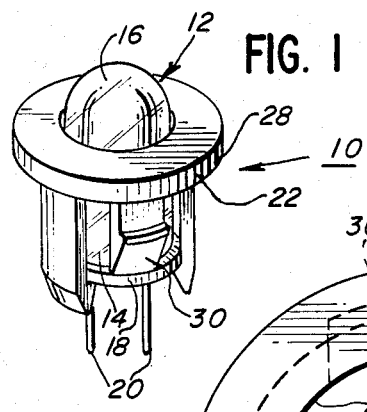
FIG. 1 is a perspective view of the light emitting diode holder illustrating the preferred embodiment of this invention and shown with a light emitting diode installed in the holder.
Figure 2:
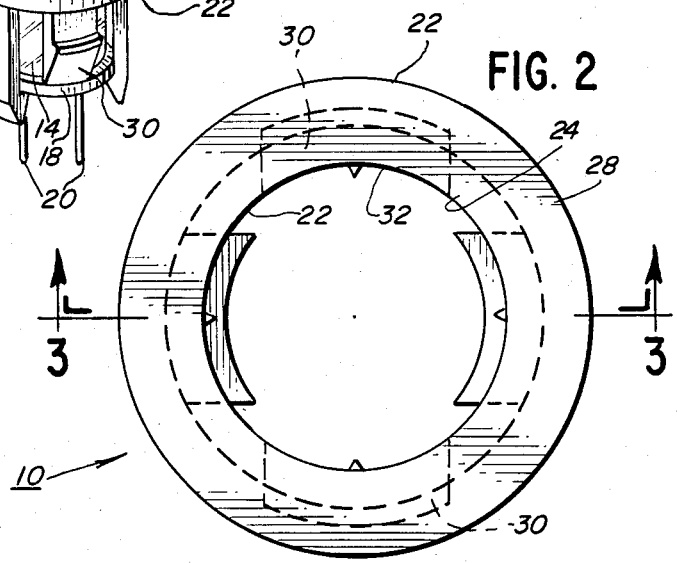
FIG. 2 is a top elevational view of the preferred embodiment of this invention.

Referring to the drawing, there is illustrated a light emitting diode holder generally designated by the reference numeral 10 and embodying the principles of this invention. For purposes of illustration, the light emitting diode holder 10 is shown with a light emitting diode in an installed position in FIGS. 1, 3 and 4. The light emitting diode is depicted as having a cylindrical body 14 (partially shown in FIGS. 3 and 4) with a spherical upper end 16 and a circumferential flange 18 about the lower end, which end is perpendicular to the axis of the diode 12. A pair of metallic wires or leads 20 extend from the base of the light emitting diode 12.

The holder 10 is molded of resilient plastic and includes an annular body 22 having an inner diameter 24 just slightly greater than the diameter of the cylindrical body 14 of the LED 12. The outer diameter 26 of the annular body 22 is sufficiently great as to extend beyond an aperture formed in a plate in which the holder and LED are to be installed.

The holder 10 is provided with a pair of diametrically disposed short leg members 30 extending downwardly from the annular body 22. Each such leg member has an arcuate extent of approximately sixty degrees and an inner diameter 32 is of the same diameter as aperture 24 of annular body 22. Each short leg member 30 further has a diagonal shoulder 34 which functions to wedgingly lock the LED holder under a panel.

The holder 10 is further provided with a second pair of retaining leg members 40 which are substantially longer than the previously described leg members 30. Fingers 40 are diametrically spaced from one another and are spaced ninety degrees from the leg members 30, and each is of substantially the same arcuate extent as leg members 30.

The long leg members 40 have an outer diameter 42 equal to the outer diameter of short leg members 30, which dimension is selected to fit into a particular size aperture of a panel. The internal diameter 44 of the pair of long leg members 40 is approximately equal to the circumferential flange 18 of LED 12.

At the free end of the flexible long leg members 40 there is provided a pair of inwardly directed retaining shoulders 46. Each free end 48 has an internal chamfered surface 50 facilitating axial insertion of the diode 12 from the bottom of the holder 10.

The natural angular orientation of the retaining shoulder 46 relative to the axis of annular body 22 is to form the retaining shoulder surface to be in direct alignment with a radial line of annular body 22. In using a light emitting holder of the type illustrated in the drawings with a zero degree angular orientation for shoulder 46, it was found that an axially directed force on the spherical upper end 16 of light emitting diode 12 would force the free end 48 of resilient legs 40 to radially spread apart and allow the light emitting diode 12 to be dislodged from holder 10. Experimentation with the angle of the shoulder 46 developed a range of angles that greatly strengthen the capability of resilient leg portions 40 to hold a light emitting diode in place. These experimentations proved that the angle A which is measured relative to a radial line to the center axis of body 22 must be formed by slanting the pair of shoulders 46 between five to eight degrees towards the flange 23. The optimum angle has been determined to be at five degrees.

Figure 3:
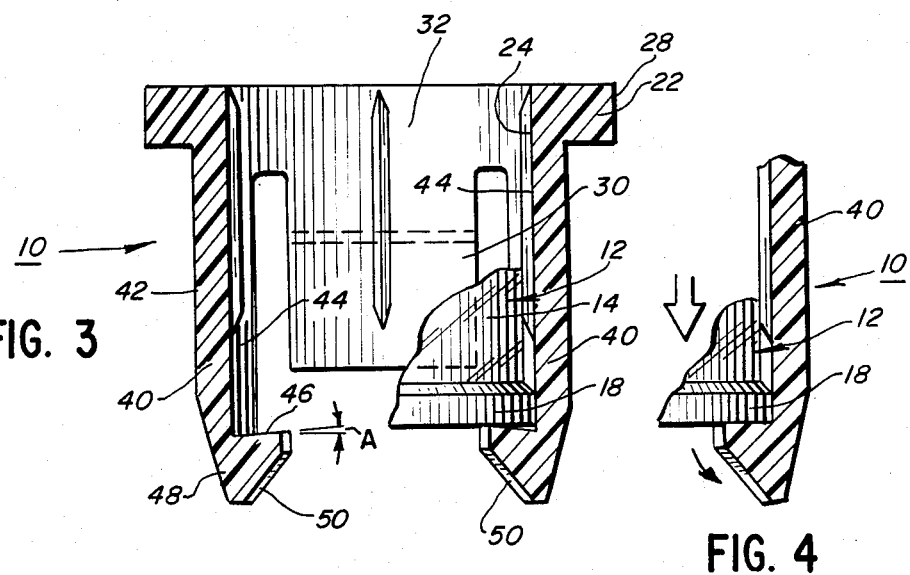
FIG. 3 is a cross-sectional view taken along the line 3—3 of FIG. 2 and looking in the direction of the arrow with the addition of a light emitting diode partially shown in an installed position.
Figure 4:
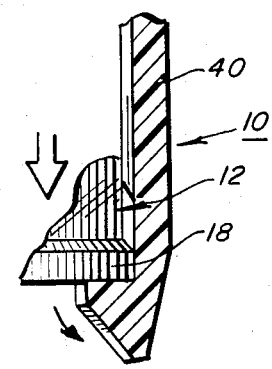
FIG. 4 is a partial cross-sectional view identical to FIG. 3 with the exception that the interaction between the light emitting diode and the holder is shown when an axially directed force is applied to the light emitting diode.

As depicted in FIG. 3, when each shoulder 46 is formed at the angle A, the base of the LED 12 rests on the outer tip of the pair of shoulders 46 when inserted into the LED holder 10. When a downward force is applied to the LED 12 in the direction of the arrow as represented in FIG. 4, it causes the free end 48 of the leg members 40 to fulcrum in a counterclockwise direction through a short arcuate extent until the bottom surface of the LED 12 comes in full contact with each shoulder 46. This very slight rotational movement places the free end 48 of each leg member in tension and thereby increases the holding force of the leg members 40 on the LED 12.

Should the angle A be increased beyond eight degrees, the rotational movement of the outer tip portion of free end 48 would provide a momentum force that would overcome the increased tension provided in the free end portion 48. Thus an angle greater than eight degrees would fail to hold the LED upon a downward force being exerted on it.

Another feature of this invention is the use of four axially extending crush ribs 60 on leg members 30 and crush ribs 62 on leg members 40. Ribs 60 and 62 are disposed at the mid-section of the leg members and extend from the top of the cylindrical body 22 to a distance which is greater than one-half the length of the longer legs 40.

The crush ribs 60 and 62 serve two functions. One function is to accommodate variations in the outer diameter size of LEDs. The other function is to hold LED 12 in direct alignment with the annular body 22 by accommodating for the difference in size between the smaller outer diameter size of the body portion 14 of LED 12 relative to its flange 18. Thus, crush ribs 60 and 62 hold the LED generally in axial alignment with the annular body 22.

The specific example of the invention as herein shown and described is for illustrative purposes only. Various changes in structure will no doubt occur to those skilled in the art, and will be understood as forming a part of the present invention insofar as they fall in the spirit and scope of the appended claims.

I claim:

1. An improvement in a holder for a light emitting diode which is adapted to be installed in an aperture of a panel, where said holder has a one-piece flexible cylindrical body having a flange portion with a central opening, a pair of spaced apart integrally formed resilient short leg portions extending from said flange portion axially of said cylindrical body and a pair of spaced apart integrally formed resilient long leg portions extending from said flange portion axially of said cylindrical body and spaced ninety degrees from emitting diode which is adapted to be installed in an aperture of a panel, where said holder has a one-piece flexible cylindrical body having a flange portion with a central opening, a pair of spaced apart integrally formed resilient short leg portions extending from said flange portion axially of said cylindrical body and a pair of spaced apart integrally formed resilient long leg portions extending from said flange portion axially of said cylindrical body and spaced ninety degrees from said short leg portions, said short leg portions including a means for latching said holder in an aperture on said panel, the improvement comprising: a retaining shoulder integrally formed at the extremity of each of said pair of long leg portions and extending inward of said cylindrical body, each of said retaining shoulders being disposed at an angle toward said flange portion in the range of three degrees to eight degrees relative to a radial line extending from the axis of said cylindrical body.

2. The improvement as defined in claim 1, wherein said angle is five degrees from a radial line extending from the axis of said cylindrical body.

3. The improvement as defined in claim 1, further comprising an axially extending crush rib formed on each of said short leg portions and said long leg portions.

* * * * *